United States Patent
Noh et al.

(10) Patent No.: US 12,490,459 B2
(45) Date of Patent: Dec. 2, 2025

(54) THIN FILM TRANSISTOR USING THREE-DIMENSIONAL TIN-BASED PEROVSKITE AS A SEMICONDUCTOR LAYER AND PREPARATION METHOD THEREOF

(71) Applicant: POSTECH RESEARCH AND BUSINESS DEVELOPMENT FOUNDATION, Pohang-si (KR)

(72) Inventors: Yong Young Noh, Daejeon (KR); Ao Liu, Pohang-si (KR); Huihui Zhu, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 349 days.

(21) Appl. No.: 18/004,103

(22) PCT Filed: Oct. 25, 2021

(86) PCT No.: PCT/KR2021/015009
§ 371 (c)(1),
(2) Date: Jan. 3, 2023

(87) PCT Pub. No.: WO2022/092731
PCT Pub. Date: May 5, 2022

(65) Prior Publication Data
US 2023/0268443 A1 Aug. 24, 2023

(30) Foreign Application Priority Data
Oct. 28, 2020 (KR) .......................... 10-2020-0141007

(51) Int. Cl.
*H10D 30/67* (2025.01)
*H10D 30/01* (2025.01)

(52) U.S. Cl.
CPC ........... *H10D 30/67* (2025.01); *H10D 30/031* (2025.01); *H10D 30/6729* (2025.01)

(58) Field of Classification Search
CPC ... H10D 30/67; H10D 30/6729; H10D 30/031
(Continued)

(56) References Cited

U.S. PATENT DOCUMENTS

| 6,344,662 B1 | 2/2002 | Dimitrakopoulos et al. |
| 2016/0268529 A1 | 9/2016 | Irwin et al. |

(Continued)

FOREIGN PATENT DOCUMENTS

| KR | 10-2001-0079590 | 8/2001 |
| KR | 10-2016-0095211 | 8/2016 |

(Continued)

OTHER PUBLICATIONS

KIPO, PCT Search Report of PCT/KR2021/015009 dated Feb. 8, 2022.

(Continued)

*Primary Examiner* — Norman D Richards
*Assistant Examiner* — Colin Russell Mccutcheon
(74) *Attorney, Agent, or Firm* — LEX IP MEISTER, PLLC

(57) ABSTRACT

Disclosed is a thin-film transistor including a substrate including a gate electrode formed thereon, a gate insulating film disposed on an entire face of the substrate, a semiconductor layer disposed on an entire face of the gate insulating film, and source and drain electrodes disposed on the semiconductor layer so as to be spaced apart from each other, wherein the semiconductor layer includes cesium tin triiodide ($CsSnI_3$) or methylammonium tin triiodide ($MASnI_3$), wherein the semiconductor layer further contains an additive.

2 Claims, 19 Drawing Sheets

(58) Field of Classification Search
USPC .......................................................... 257/288
See application file for complete search history.

(56) References Cited

U.S. PATENT DOCUMENTS

2018/0301288 A1  10/2018  Irwin et al.
2018/0351121 A1  12/2018  Mei et al.

FOREIGN PATENT DOCUMENTS

| KR | 20160095211 A | * | 8/2016 | ............. H10K 50/30 |
| KR | 10-2018-0100722 | | 9/2018 | |
| KR | 10-2018-0137213 | | 12/2018 | |
| KR | 10-1971325 | | 4/2019 | |
| KR | 10-2019-0135558 | | 12/2019 | |
| SG | 10201405683 Y | * | 4/2015 | ................ H01S 5/36 |
| WO | WO-2016081682 A1 | * | 5/2016 | ........... H01G 9/2036 |
| WO | 2019-195194 | | 10/2019 | |
| WO | 2020/209916 | | 10/2020 | |

OTHER PUBLICATIONS

C. R. Kagan et al., "Organic-Inorganic Hybrid Materials as Semiconducting Channels in Thin-Film Field-Effect Transistors", Science, American Association for the Advancement of Science, US, vol. 286, Oct. 29, 1999, pp. 945-947, XP000993296.
D. B. Mitzi et al., "Organic-inorganic electronics", IBM J. Res. & Dev., vol. 45, No. 1, Jan. 1, 2001, pp. 29-45, XP093038860.
Santanu Jana et al., "Toward Stable Solution-Processed High-Mobility p-Type Thin Film Transistors Based on Halide Perovskites", ACS Nano, vol. 14, No. 11, Oct. 20, 2020, pp. 14790-14797, XP093195603.
David B. Mitzi et al., "Structurally Tailored Organic-Inorganic Perovskites: Optical Properties and Solution-Processed Channel Materials for Thin-Film Transistors", Chemistry of Materials, American Chemical Society, US, vol. 13, No. 10, Oct. 1, 2001, pp. 3728-3740, XP001149871.
Long Ji et al., "Realizing Full Coverage of Stable Perovskite Film by Modified Anti-Solvent Process", Nanoscale Research Letters, Springer, US, vol. 12, No. 1, May 22, 2017, pp. 1-6, XP021245223.
EPO, Search Report of EP 21886725.7 dated Sep. 6, 2024.

* cited by examiner

THIN FILM TRANSISTOR USING THREE-DIMENSIONAL TIN-BASED PEROVSKITE AS A SEMICONDUCTOR LAYER AND PREPARATION METHOD THEREOF

TECHNICAL FIELD

The present disclosure relates to a thin-film transistor and a method for manufacturing the same. Specifically, the present disclosure relates to a transistor using three-dimensional tin-based perovskite as a semiconductor layer and a method for manufacturing the same.

The present disclosure is derived from research conducted under a group research support (R&D) of the Ministry of Science and ICT (Task identification number: 1711119390, research management institution: National Research Foundation, research project name: Research on low-dimensional perovskite optoelectronic material and device, Host institution: Industry-University Cooperation Foundation of Pohang University of Science and Technology, research period: 2020 Jul. 1 to 2021 May 31).

In addition, the present disclosure is derived from research conducted under a group research support (R&D) of the Ministry of Science and ICT (Task identification number: 1711132233, research management institution: National Research Foundation, research project name: development of high-performance TFT using halide-based ionic semiconductor, Host institution: Industry-University Cooperation Foundation of Pohang University of Science and Technology, research period: 2021 Mar. 1 to 2022 Feb. 28).

There is no property interest of the Korean government in any aspect of the present disclosure.

BACKGROUND ART

Currently, megatrends in the display market are moving further from the existing high-efficiency, high-resolution display to the emotional quality display that aims to realize high color purity and natural color. Accordingly, organic light-emitting diodes (OLED) based on organic light-emitting materials have made rapid progress. Due to the low charge mobility of organic semiconductors or oxide transistors, thin-film transistors have low mobility, which limits their use as driving elements for high-resolution displays. Currently, metal oxide semiconductor or polycrystalline silicon inorganic thin-film transistors are used as driving transistors for the organic light-emitting diodes. However, because the inorganic thin-film transistor requires a high-temperature process of about 300° C., it is difficult to apply the inorganic thin-film transistor to a flexible device based on a plastic substrate. In order to overcome this limitation, various studies are being conducted on a semiconductor material that can be formed on the plastic substrate at a low process temperature and exhibits high mobility.

Perovskite is a material with a unique crystal structure composed of two cations and one anion. The organic-inorganic hybrid perovskite material in which organic cations and inorganic cations and halide anions are used is currently being studied mainly as a light absorber for solar cells. However, regarding characteristics thereof, high charge mobility is expected due to the low effective mass of electrons or holes. Thus, the organic-inorganic hybrid perovskite material has great potential as a material of a transistor. Further, halide-based perovskite material can be formed into a thin film using a solution-phase coating process and thus a manufacturing cost thereof is low and a manufacturing process thereof and a device manufacturing process using the same are simple, and it is easy to control optical and electrical properties thereof. Thus, the halide-based perovskite material is receiving attention both academically and industrially. Moreover, in the halide-based perovskite, various materials may be used as cations and anions, such that electrical properties may be controlled via a combination of cations and anions, thereby providing customized electronic materials to various application fields.

DETAILED DESCRIPTION OF THE INVENTION

Technical Problem

A purpose of the present disclosure is to provide a thin-film transistor having high charge mobility characteristics and a method for manufacturing the same.

Further, a purpose of the present disclosure is to provide a thin-film transistor as an environmentally friendly material that does not include lead and thus is easily industrialized, and a method for manufacturing the same.

The technical purposes to be achieved in accordance with the present disclosure are not limited to the technical purposes as mentioned above. Those skilled in the art may clearly appreciate other technical purposes as not mentioned from the descriptions below.

Technical Solution

A thin-film transistor according to one embodiment of the present disclosure may include a substrate including a gate electrode formed thereon, a gate insulating film disposed on an entire face of the substrate, a semiconductor layer disposed on an entire face of the gate insulating film, and source and drain electrodes disposed on the semiconductor layer so as to be spaced apart from each other, wherein the semiconductor layer may include cesium tin triiodide ($CsSnI_3$) or methylammonium tin triiodide ($MASnI_3$), wherein the semiconductor layer may further contain an additive.

Further, the additive may be added at a content of 1 mol % to 30 mol % based on the semiconductor layer.

Further, the additive may include one of $SnF_2$, $SnBr_2$, $SnI_2$, and $SnCl_2$.

Further, the additive may include one of $PbI_2$, $InI_2$, and $SbI_2$.

Further, the additive may be a mixture of a first additive and a second additive, wherein the first additive may include one of $SnF_2$, $SnBr_2$, $SnI_2$, and $SnCl_2$, wherein the second additive may include one of $PbI_2$, $InI_2$, and $SbI_2$.

A method for manufacturing a thin-film transistor according to one embodiment of the present disclosure may include forming a gate electrode on a substrate, forming a gate insulating film on an entire face of the substrate including the gate electrode, forming a semiconductor layer on the gate insulating film, and forming a source electrode and a drain electrode on the semiconductor layer so as to be spaced apart from each other, wherein in the forming of the semiconductor layer, the semiconductor layer may include cesium tin triiodide ($CsSnI_3$) or methylammonium tin triiodide ($MASnI_3$), wherein the forming of the semiconductor layer may include adding an additive into the semiconductor layer.

Further, the forming of the semiconductor layer may include forming the semiconductor layer using one selected from spin coating, bar coating, spray, inkjet, flexography, screening, dip-coating, chemical vapor deposition (CVD), atomic layer deposition (ADL), sputtering, thermal evaporation, and gravure.

Further, in the adding of the additive into the semiconductor layer, the additive may be added at a content of 1 mol % to 30 mol % based on the semiconductor layer.

Further, in the adding of the additive into the semiconductor layer, the additive may include one of $SnF_2$, $SnBr_2$, $SnI_2$, and $SnCl_2$.

Further, in the adding of the additive into the semiconductor layer, the additive may include one of $PbI_2$, $InI_2$, and $SbI_2$.

Further, in the adding of the additive into the semiconductor layer, the additive may be a mixture of a first additive and a second additive, wherein the first additive may include one of $SnF_2$, $SnBr_2$, $SnI_2$, and $SnCl_2$, wherein the second additive may include one of $PbI_2$, $InI_2$, and $SbI_2$.

Advantageous Effects of the Invention

According to an embodiment of the present disclosure, a thin-film transistor having high charge mobility characteristics may be provided.

Further, a thin-film transistor as an eco-friendly material that does not include lead and thus is easily industrialized may be provided.

Further, a semiconductor material based on $CsSnI_3$ or $MASnI_3$ exhibits high off state current characteristics due to a high charge amount. Thus, when the material is formed into a thin film, the thin film may be disadvantageously used as a transistor semiconductor. However, adding a specific additive thereto to effectively lower the charge amount thereof may allow the material to be used as a material of a transistor having excellent characteristics.

The effects that may be obtained from the present disclosure are not limited to the effects as mentioned above. Those of ordinary skill in the art to which the present disclosure belongs may clearly appreciate other effects that are not mentioned above and may be obtained from the descriptions below.

BEST MODE

Figure 1:
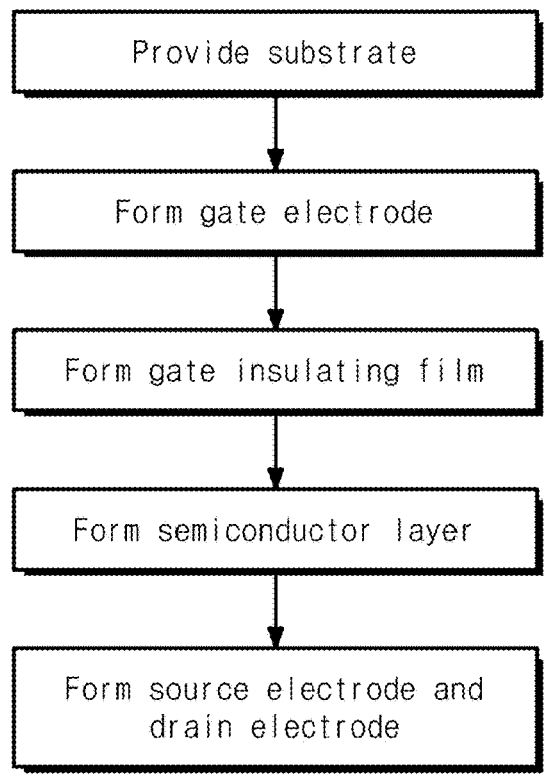
FIG. 1 is a flowchart showing a manufacturing process of a thin-film transistor according to the present disclosure.

Hereinafter, an embodiment of the present disclosure will be described in more detail with reference to the accompanying drawings. An embodiment of the present disclosure may be modified in various forms, and the scope of the present disclosure should not be construed as being limited to the following embodiments. This embodiment is provided such that those with average knowledge in the art more completely understands the present disclosure. Therefore, a shape of each of elements in the drawings is exaggerated for clearer descriptions.

A configuration of the present disclosure for clarifying the solution to the problem to be solved by the present disclosure is described in detail with reference to the accompanying drawings based on a preferred embodiment of the present disclosure. In assigning reference numerals to the components of the drawings, the same reference numerals are allocated to the same components even though they were on different drawings. In the description of the present drawings, components of other drawings may be cited when necessary.

An example in which a transistor according to the present disclosure has a BGTC (Bottom Gate Top Contact) structure is described. However, the present disclosure is not limited thereto. The transistor according to the present disclosure may have a BGBC (Bottom Gate Bottom Contact) structure.

Figure 2:
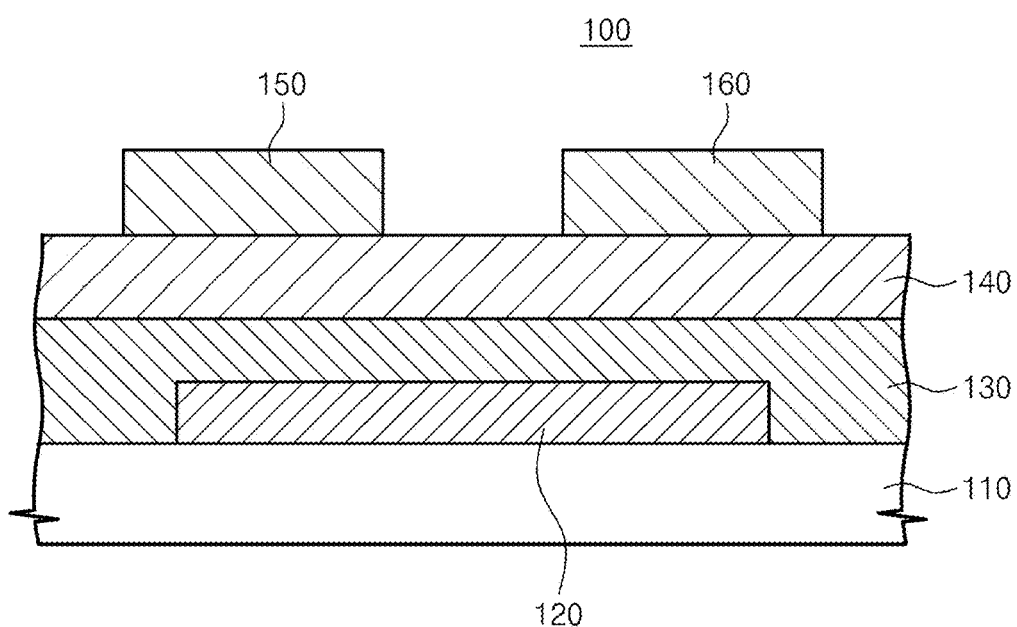
FIG. 2 is an illustrative view schematically showing a thin-film transistor according to the present disclosure.

FIG. 1 is a flowchart showing a manufacturing process of a thin-film transistor according to the present disclosure, and FIG. 2 is an illustrative diagram schematically illustrating a thin-film transistor according to the present disclosure.

A bottom type thin-film transistor may be manufactured by providing a substrate, forming a gate electrode on the substrate, forming a gate insulating film on the gate electrode, forming an organic semiconductor layer on the gate insulating film, and forming source/drain electrodes on the organic semiconductor layer so as to be spaced apart from each other.

Referring to FIG. 1 and FIG. 2, a provided substrate 110 may include a silicon wafer doped with n-type or p-type dopants, a glass substrate, a plastic film made of one selected from a group consisting of polyethersulphone, polyacrylate, polyetherimide, and polyimide, polyethylene terephthalate, and polyethylene naphthalate, or a glass substrate and a plastic film coated with indium tinoxide. However, the present disclosure is not limited thereto.

A gate electrode 120 may be made of one selected from aluminum (Al), gold (Au), silver (Ag), aluminum alloy (Al-alloy), molybdenum (Mo), molybdenum alloy (Mo-alloy), silver nanowire, gallium indium eutectic, and PEDOT;PSS. The gate electrode may be manufactured via a printing process such as inkjet printing or spraying using ink containing the above materials. Via this printing process, the gate electrode 120 may be formed and thus a vacuum process may be eliminated, so that a manufacturing cost reduction effect may be expected.

A gate insulating film 130 may be formed on an entire face of the substrate 110 including the gate electrode 120.

The gate insulating film 130 includes a single film or a multi-layer film of an organic insulating film or an inorganic insulating film, or an organic-inorganic hybrid film. The organic insulating film may include at least one of polymethacrylate (PMMA), polystyrene (PS), phenol-based polymers, acrylic-based polymers, imide-based polymers such as polyimide, arylether-based polymers, amide-based polymers, fluorine-based polymers, p-xylene-based polymers, vinyl alcohol-based polymers, or parylene. The inorganic insulating film may include one or more selected from a silicon oxide film, a silicon nitride film, $Al_2O_3$, $HfOx$, $Ta_2O_5$, BST, and PZT.

A semiconductor layer 140 may be formed on an entire face of the gate insulating film 130.

The semiconductor layer 140 may include cesium tin triiodide ($CsSnI_3$) or methylammonium tin triiodide ($MASnI_3$).

Further, the semiconductor layer 140 may contain at least one additive.

The additive may be added in an amount of 1 mol % to 30 mol % based on the semiconductor layer.

In this regard, when the additive is added at a content smaller than 1 mol %, a charge amount reduction effect is insignificant, so that an off current is still high, and thus a low current on/off ratio may occur. To the contrary, when the additive is added in excess of 30 mol %, the additives agglomerate with each other, thereby lowering the charge mobility.

The additive may include a first additive and a second additive. In this regard, the first additive and the second additive may be added individually or a mixture of the first additive and the second additive may be added.

In this regard, the first additive may include $SnF_2$ or any one of $SnBr_2$, $SnI_2$, and $SnCl_2$, and the second additive may include $PbI_2$, or any one of $InI_2$, and $SbI_2$.

In this regard, Pb contained in the second additive may be added in a trace amount at an environmentally harmless level.

That is, the additive may include any one of $SnF_2$, $SnBr_2$, $SnI_2$, and $SnCl_2$, any one of $PbI_2$, $InI_2$, and $SbI_2$, or any one of $SnF_2$:$PbI_2$, $SnF_2$:$InI_2$, $SnF_2$:$SbI_2$, $SnBr_2$:$PbI_2$, $SnBr_2$:$InI_2$, $SnBr_2$:$SbI_2$, $SnI_2$:$PbI_2$, $SnI_2$:$InI_2$, $SnI_2$:$SbI_2$, $SnCl_2$:$PbI_2$, $SnCl_2$:$InI_2$, and $SnCl_2$:$SbI_2$.

In one example, in accordance with the present disclosure, the first additive and the second additive may be mixed with each other and then a mixture thereof may be added to the semiconductor layer. The first additive may contain Sn and thus may effectively passivate Sn vacancies formed during thin-film formation. The second additive may contain Pb, In or Sb such that the Sn vacancies are substituted with Pb, In or Sb to reduce an amount of the Sn vacancies.

In this regard, when the mixture of the first additive and the second additive are added thereto, the first additive and the second additive may be mixed with each other at a mixing ratio in a range of 10:90 to 90:10, preferably, 30:70 to 70:30, more preferably, 40:60 to 60:40.

In one example, the semiconductor layer 140 may be formed by mixing the above material for the semiconductor layer 140 with a solvent such as acetyl-nitrile to prepare a solution and performing a solution process using the solution at room temperature.

The semiconductor layer 140 may be formed on the gate insulating film 130 using any one selected from spin coating, bar coating, spray, inkjet, flexography, screening, dip-coating, chemical vapor deposition (CVD), atomic layer deposition (ADL), sputtering, thermal evaporation, and gravure. After forming the semiconductor layer 140, heat treatment or optical exposure may be performed thereon to improve element performance such as semiconductor crystallinity and stability.

In particular, in the transistor according to the present disclosure, the semiconductor layer 140 of an ultra-thin structure may be formed using spin coating or bar coating.

Further, a thickness of the semiconductor layer 140 may be in a range of 3 nm to 10 nm, and thus transparency thereof may be excellent and may maintain 85 to 90% transparency.

Further, due to this ultra-thin structure, the semiconductor layer 140 may be applied to a flexible device.

Further, the source/drain electrodes 151 and 152 may be formed on the semiconductor layer 140 so as to be spaced apart from each other.

Each of the source/drain electrodes 151 and 152 may be formed as a single layer made of one selected from Au, Al, Ag, Mg, Ca, Yb, Cs-ITO or alloys thereof. In order to improve adhesion thereof with the substrate, each of the source/drain electrodes 151 and 152 may further include an adhesive metal layer made of a metal such as Ti, Cr or Ni and thus may be formed as multiple layers. Alternatively, each of the source/drain electrodes 151 and 152 may be made of graphene, carbon nanotube (CNT), PEDOT:PSS conductive polymer silver nanowire, etc., and thus may be more elastic and flexible than one made of a conventional metal may be. The source/drain electrodes may be manufactured via a printing process such as inkjet printing or spraying using ink containing the above materials. Via this printing process, the source/drain electrodes may be formed and thus the vacuum process may be excluded, so that manufacturing cost reduction may be expected.

A transistor 100 having the above structure as shown in FIG. 2 may be manufactured.

Characteristic Measurement

Hereinafter, with reference to FIG. 5 to FIG. 10, a transfer curve, a current curve (output curve), and characteristics of a thin-film transistor according to an embodiment of the present disclosure are described.

Figure 3A:
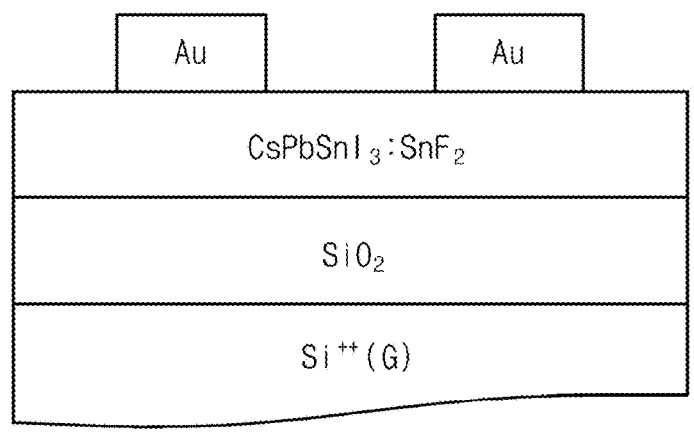
FIG. 3 is a graph showing a structure and a transfer curve of a thin-film transistor according to one embodiment of the present disclosure.
Figure 3B:
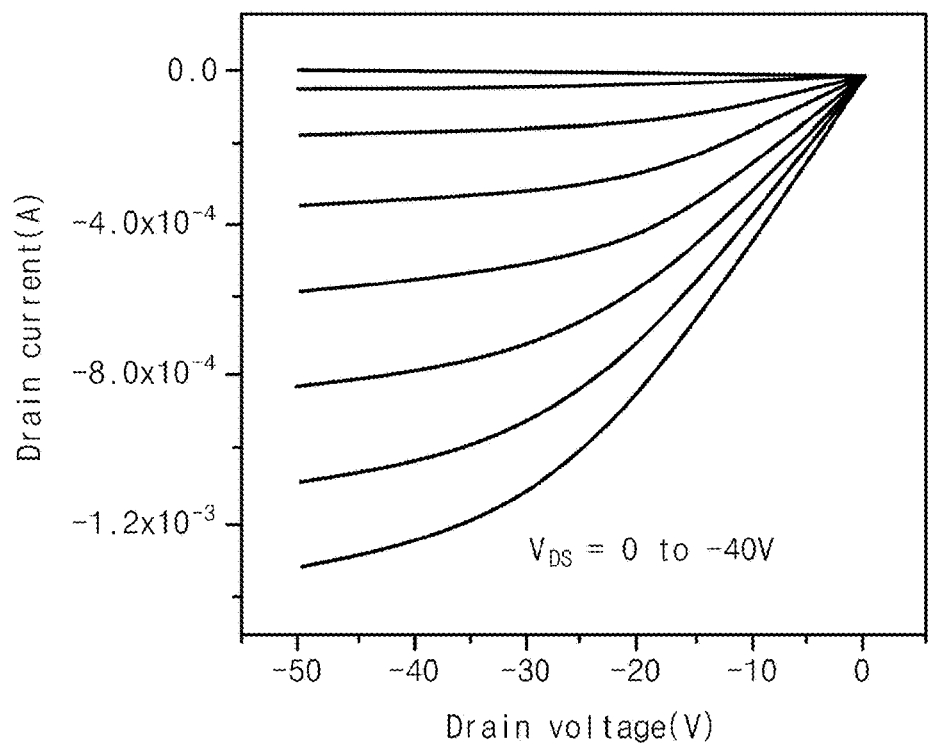
Figure 3C:
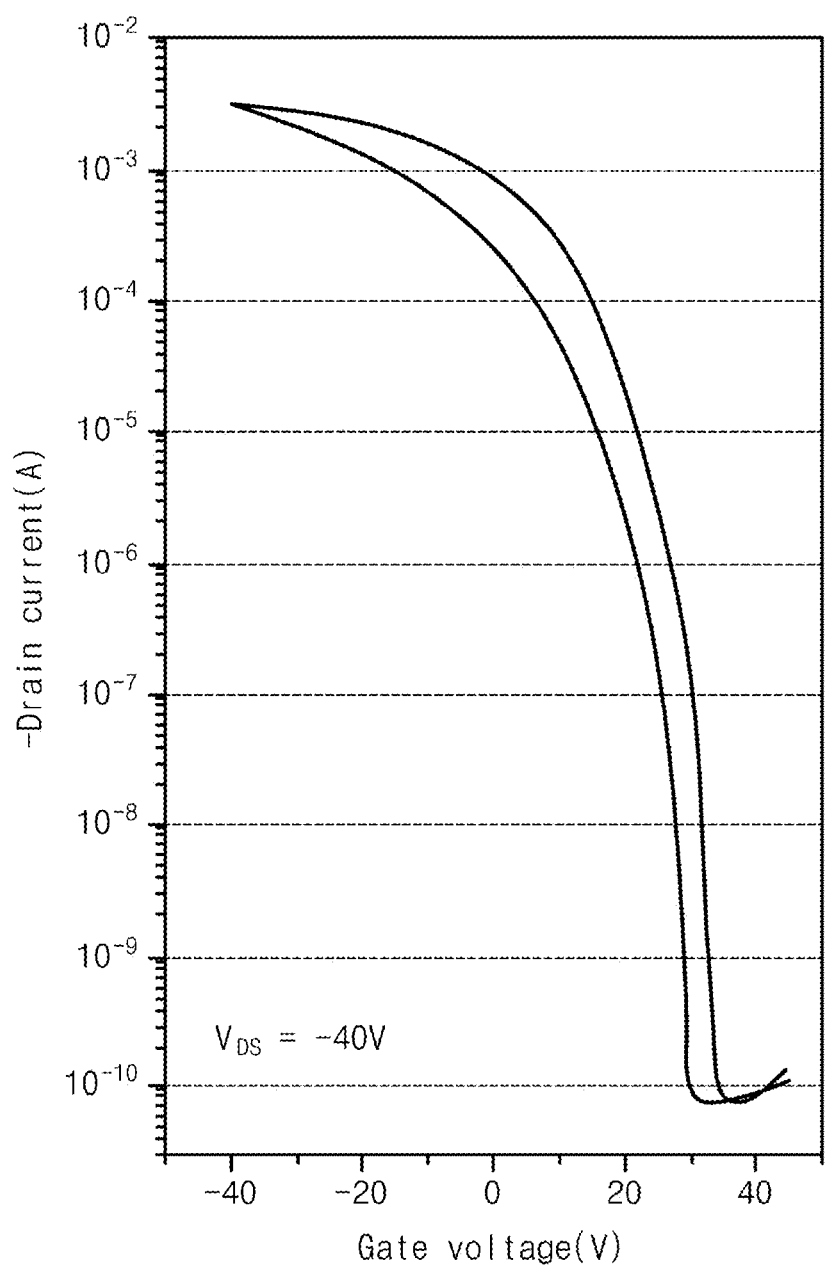
Figure 4A:
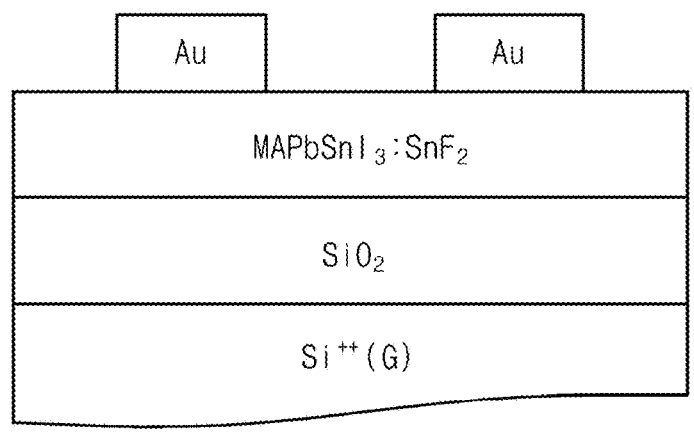
FIG. 4 is a graph showing a structure and a transfer curve of a thin-film transistor according to another embodiment of the present disclosure.

In each of the semiconductor layer according to one embodiment according to FIG. 3 and the semiconductor layer according to another embodiment according to FIG. 4, a perovskite material was formed on the electrode by dissolving CsI or methylammonium iodide and $SnI_2$ precursor in DMF or DMSO solution at 0.1 wt % to 50 wt % depending on a thickness of a thin-film to be formed to prepare a solution and then applying the solution on the electrode using spin coating.

In one example, alternatively, a perovskite material may be formed on the electrode by a vacuum deposition process using thermal evaporation of CsI or methylammonium iodide and the $SnI_2$ precursor as described above in a vacuum chamber. In the vacuum evaporation, the above additive may be introduced into perovskite via thermal evaporation.

However, the perovskite-based semiconductor layer for the TFT may be formed using vacuum deposition through thermal evaporation, a solution process (spin coating, bar coating, slot coating, inkjet, dispensing, spray coating, etc.) or a mixed process (two-step process: vacuum deposition and subsequent solution process). However, the present disclosure is not limited to these processes.

FIG. 3 is a graph showing a structure and a transfer curve of a thin-film transistor according to one embodiment of the present disclosure. FIG. 4 is a graph showing a structure and a transfer curve of a thin-film transistor according to another embodiment of the present disclosure.

Referring to FIG. 3, in the thin-film transistor according to one embodiment of the present disclosure, the semiconductor layer 140 may include cesium tin triiodide ($CsSnI_3$) and the aforementioned additive. Referring to FIG. 4, in the thin-film transistor according to one embodiment of the present disclosure, the semiconductor layer 140 may include methylammonium tin triiodide ($MASnI_3$) and the aforementioned additive.

FIG. 3B and FIG. 3C are graphs showing a transfer curve of a thin-film transistor according to one embodiment of the present disclosure. The transfer curve represents current I flowing through the semiconductor layer including $CsSnI_3$ according to application of a gate voltage VG. In this case, a voltage between the source electrode and the drain electrode was set to −40V (Vds=−40V).

In this regard, when forming the semiconductor layer, CsI and $SnI_2$ precursors are dissolved in the DMF or DMSO solution, and then $SnF_2$ and $PbI_2$ additives are added thereto. A result as shown in FIG. 3 is identified.

In this regard, a mixing ratio of the two additives may be 1:2. $SnF_2$ may be added at 5 mol % and $PbI_2$ at 10 mol %, based on the semiconductor layer.

Referring to FIG. 3B and FIG. 3C, it may be identified that the thin-film transistor according to one embodiment of the present disclosure exhibits typical P-type transistor characteristics. In this regard, the mobility is in a range of about 30 to 40 cm$^2$/VS, and the current on/off ratio is greater than or equal to 108. Thus, the thin-film transistor exhibits excellent characteristics.

Figure 4B:
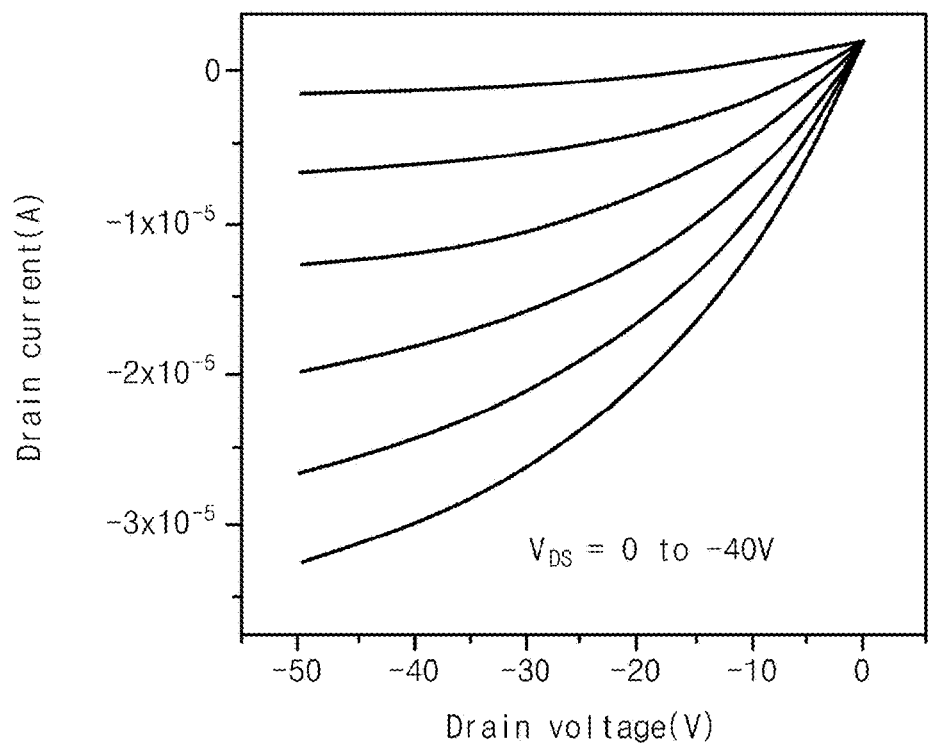
Figure 4C:
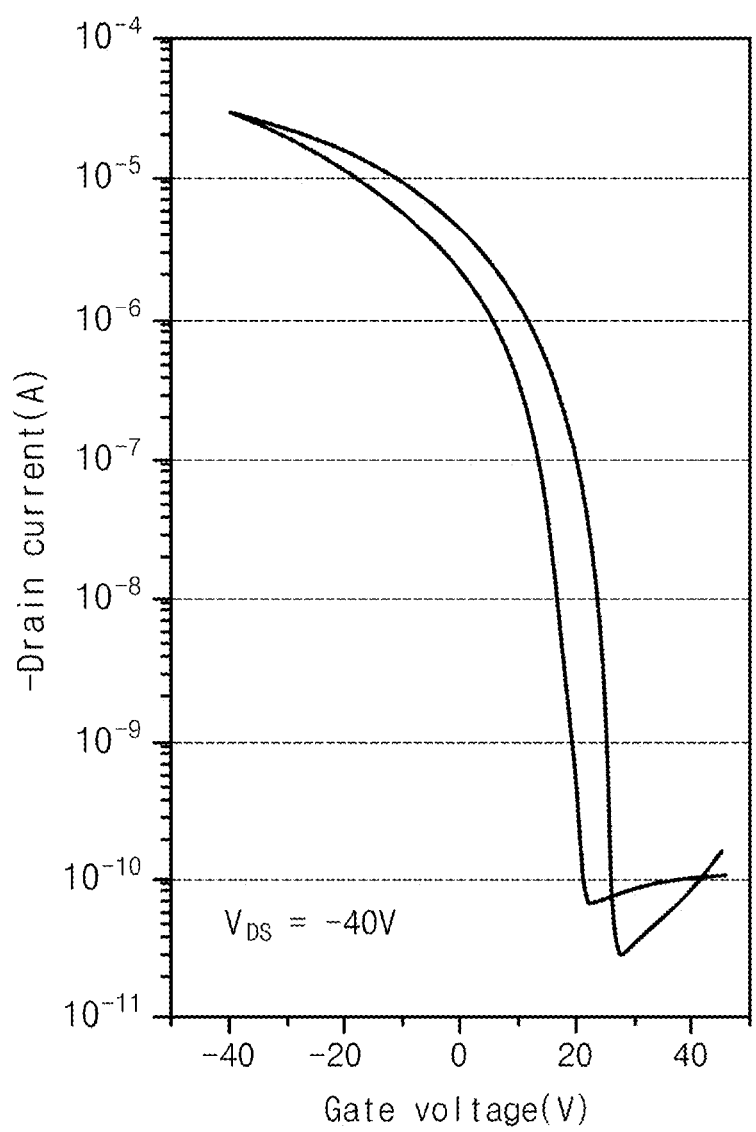

FIG. 4B and FIG. 4C are graphs showing a transfer curve of a thin-film transistor according to another embodiment of the present disclosure. The transfer curve represents current I flowing through the semiconductor layer including $MASnI_3$ according to application of a gate voltage VG. In this case, a voltage between the source electrode and the drain electrode was set to −40V (Vds=−40V).

In this regard, when forming the semiconductor layer, MAI and $SnI_2$ precursors are dissolved in the DMF or DMSO solution, and then $SnF_2$ and $PbI_2$ additives are added thereto. A result as shown in FIG. 4 is identified.

In this regard, a mixing ratio of the two additives may be 1:2. $SnF_2$ may be added at 5 mol % and $PbI_2$ at 10 mol %, based on the semiconductor layer.

Referring to FIG. 4B and FIG. 4C, it may be identified that the thin-film transistor according to one embodiment of the present disclosure exhibits P-type transistor characteristics. In this regard, the mobility is in a range of about 20 to 30 cm$^2$/VS, and the current on/off ratio is greater than or equal to 108. Thus, the thin-film transistor exhibits excellent characteristics.

FIG. 5 to FIG. 9 are graphs showing change in characteristics due to the addition of the additive in the thin-film transistor according to one embodiment of the present disclosure.

Specifically, FIG. 5 shows the transfer curves of the $MASnI_3$ and $CsSnI_3$ transistors, respectively.

Figure 5A:
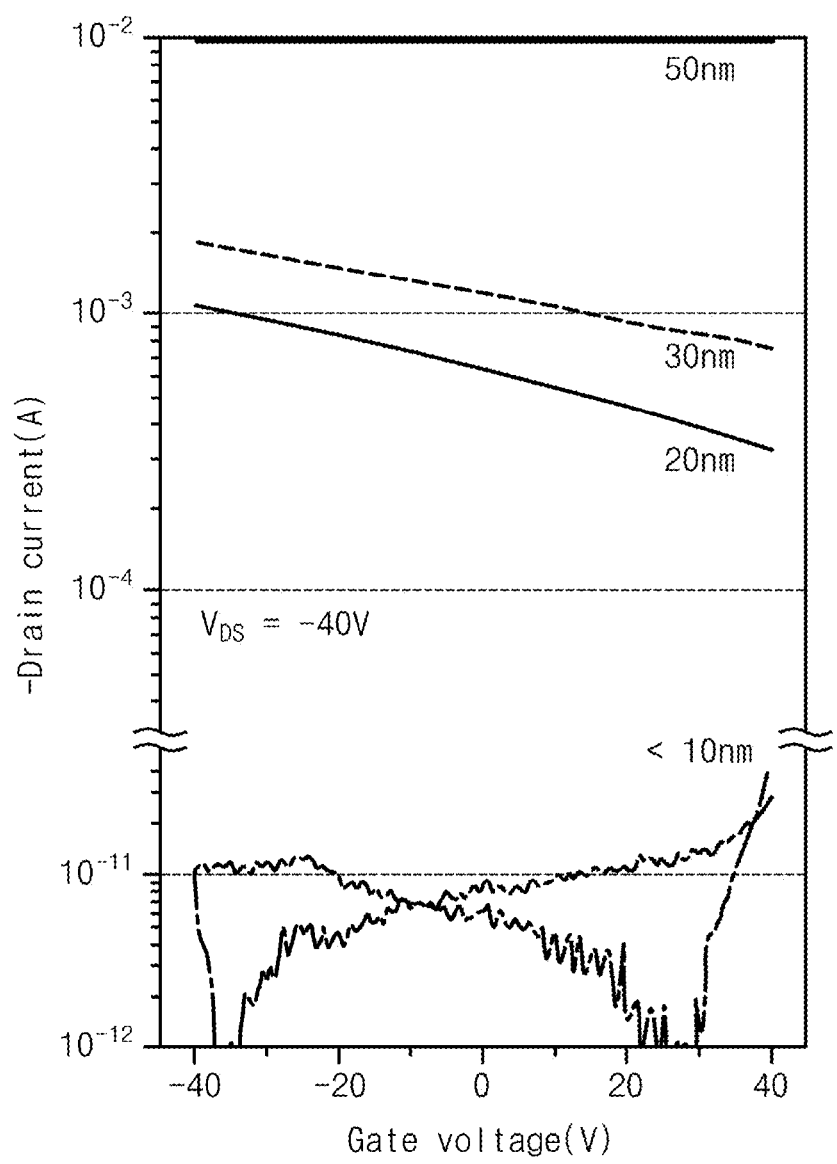
FIG. 5 to FIG. 10 are graphs showing change in characteristics due to addition of an additive in a thin-film transistor according to one embodiment of the present disclosure.

FIG. 5A shows the transfer curve of the $MASnI_3$ TFT without the additive. In this case, it may be identified that the TFT exhibits a very low on/off ratio, and thus turn on/off does not occur.

Further, it may be identified that in the $MASnI_3$ TFT without the additive, the Sn vacancy may occur during transistor thin-film formation and thus may function as a conductor. According to FIG. 5A, it may be identified that the larger a thickness of the thin-film, the greater a charge amount and thus the larger a current amount.

Figure 5B:
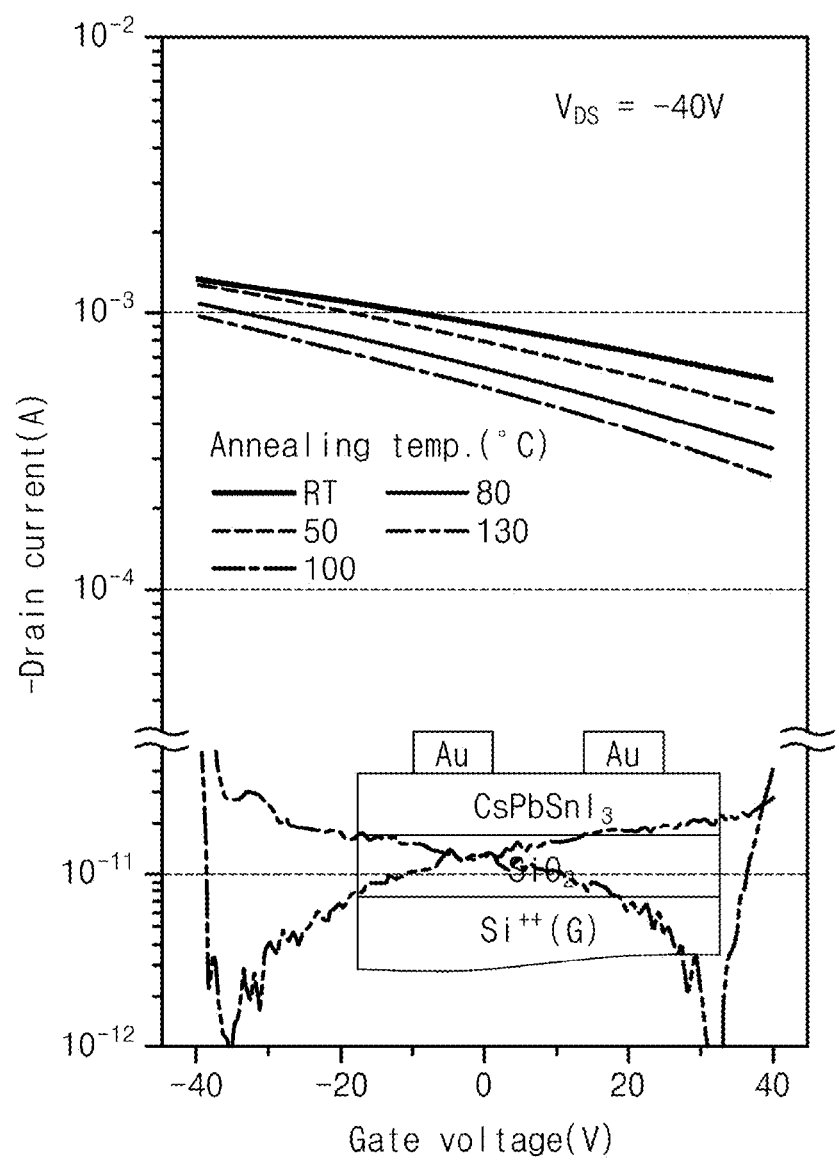

FIG. 5B shows the transfer curve of the $CsSnI_3$ TFT without the additive. As shown in FIG. 5B, it may be identified that in the $CsSnI_3$ TFT without the additive, the Sn vacancy may occur during transistor thin-film formation and thus may function as a conductor.

FIG. 6 shows an XRD analysis result (a), a SEM image (b), a SIMS spectrum result (c), a TEM image, a HRTEM image, and a TTF pattern (d) due to additive addition in a thin-film transistor according to one embodiment of the present disclosure.

Figure 6A:
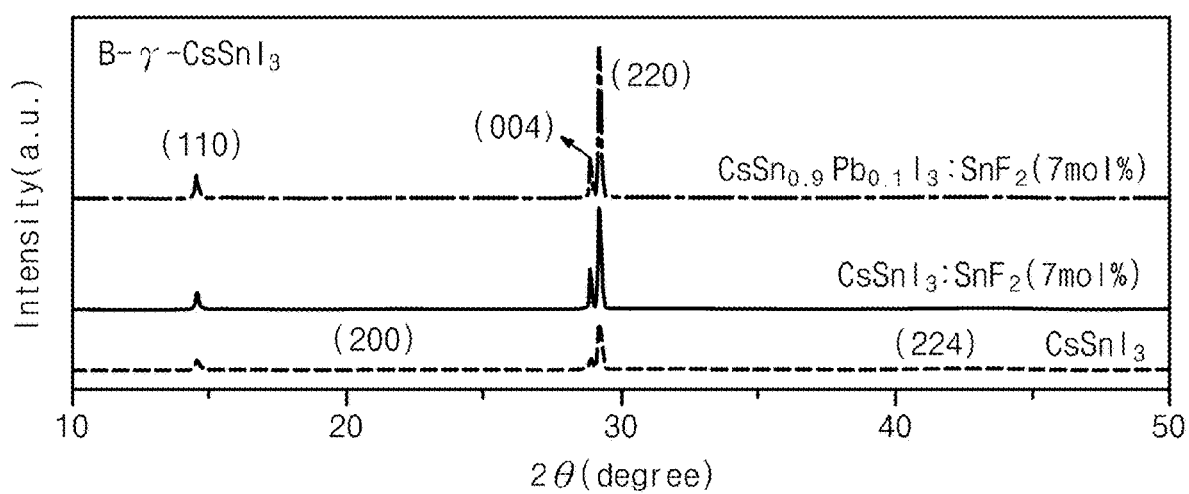

First, referring to FIG. 6A, it may be identified that crystallinity is improved when $SnF_2$ additive is added to the perovskite semiconductor layer ($CsSnI_3$), and the crystallinity is further improved when a mixture of $SnF_2$/$PbI_2$ additives is added thereto. In other words, it may be identified that the crystallinity improvement is greater when a mixture of the two additives is added thereto.

Figure 6B:
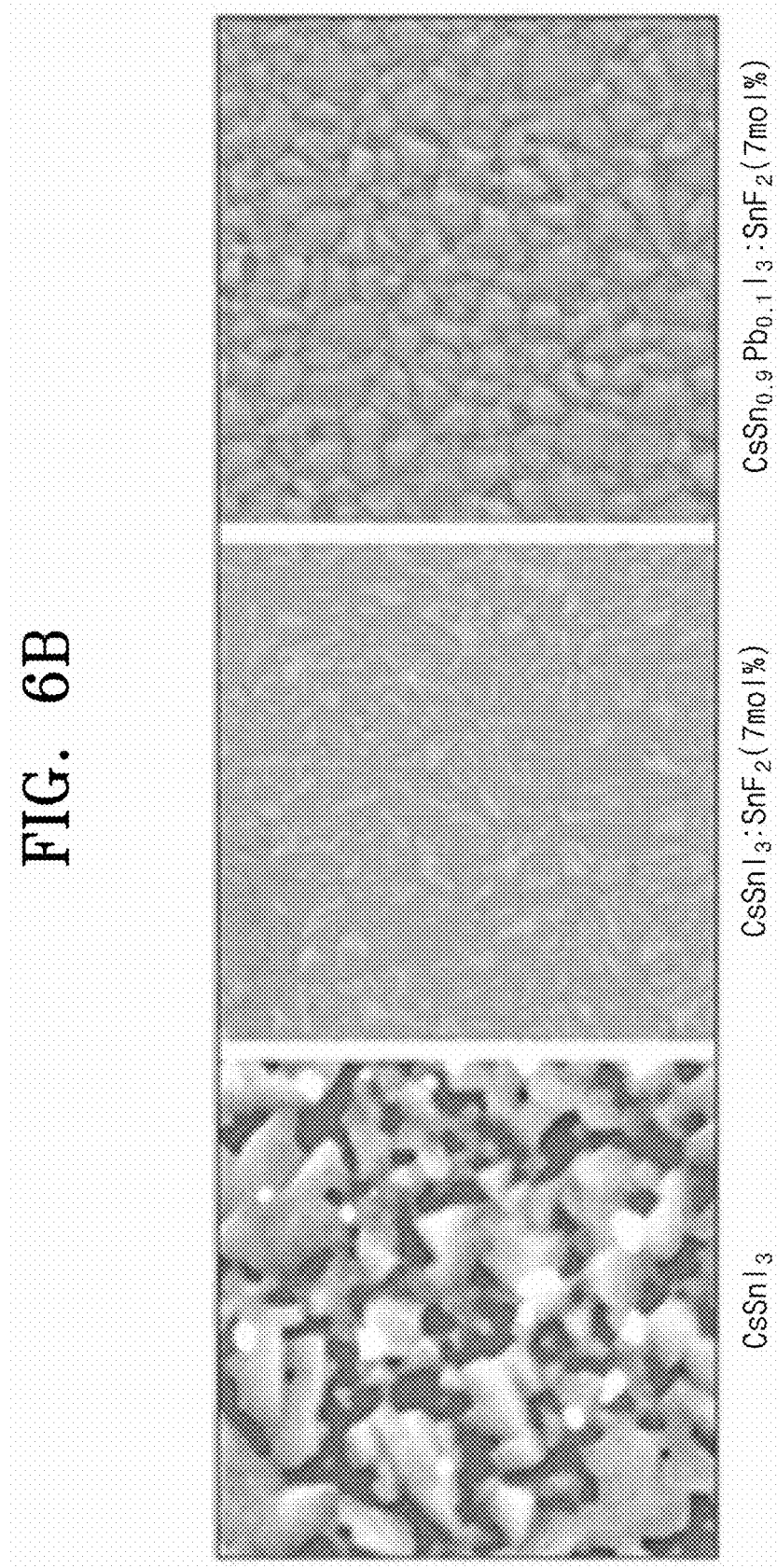

Further, referring to FIG. 6B, a resulting structure when each of $SnF_2$ or $SnF_2$/$PbI_2$ is added to the perovskite semiconductor layer ($CsSnI_3$) may be identified.

Figure 6C:
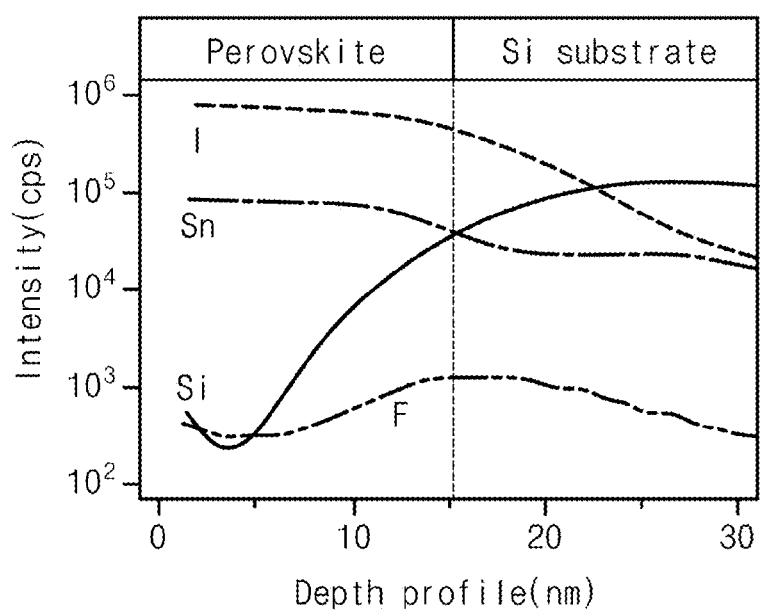

Further, referring to FIG. 6C, it may be identified that the additive $SnF_2$/$PbI_2$ is added into the semiconductor layer ($CsSnI_3$) and is present throughout bulk of a film.

Figure 6D:
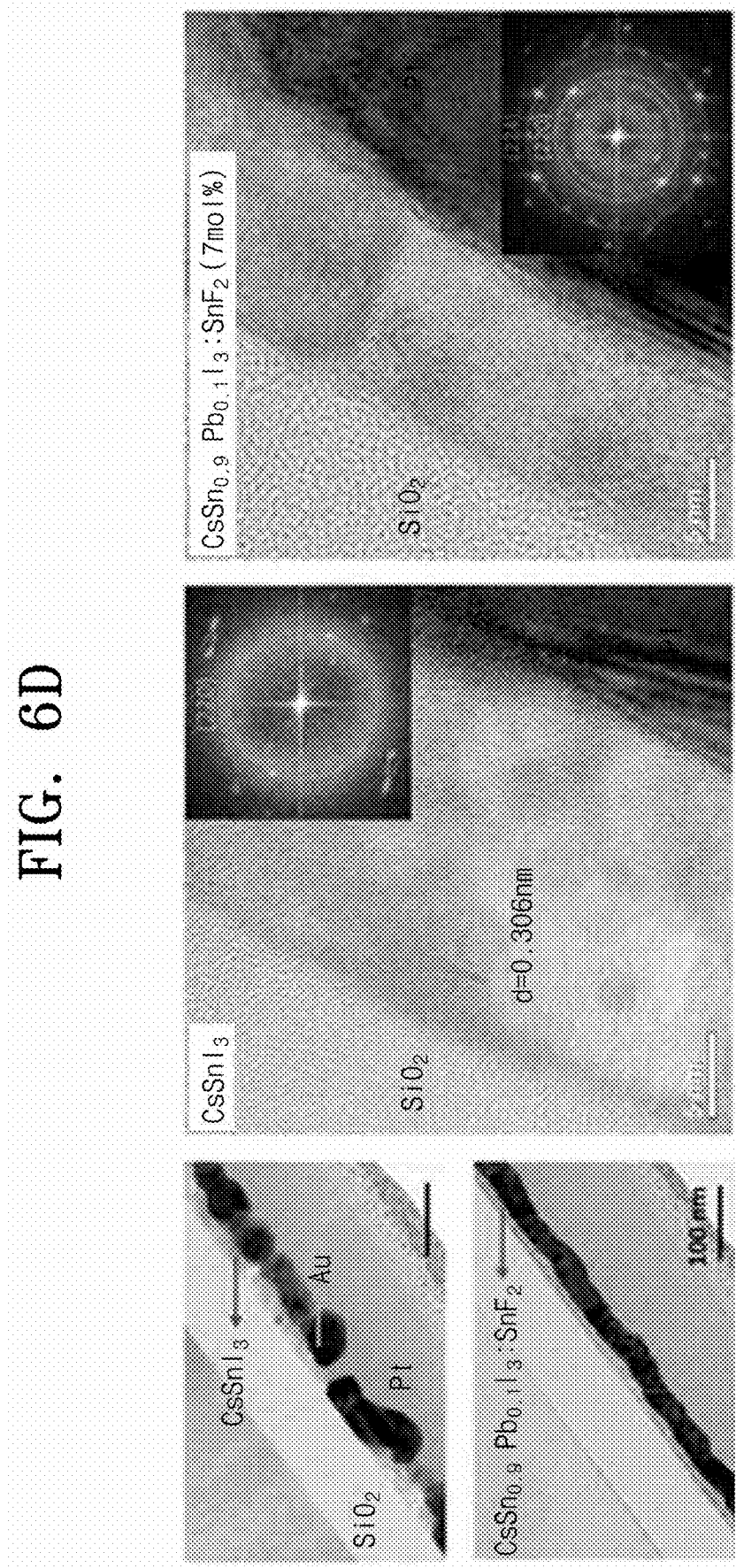

Further, referring to FIG. 6D, it may be identified that the crystallinity of the semiconductor layer ($CsSnI_3$) is not significantly affected even when a mixture of the first additive and the second additive is added thereto.

Further, FIG. 7 shows change (a) in a mobility and a current on/off ratio of a thin-film transistor according to one embodiment of the present disclosure when each of $SnF_2$, $SnBr_2$, and $SnI_2$ additives is added to the semiconductor layer, and a mobility and a current on/off ratio (b) of the thin-film transistor based on a ratio of a Sn content and a Pb content when a mixture of the additives $SnF_2$ and $PbI_2$ is added thereto.

Figure 7A:
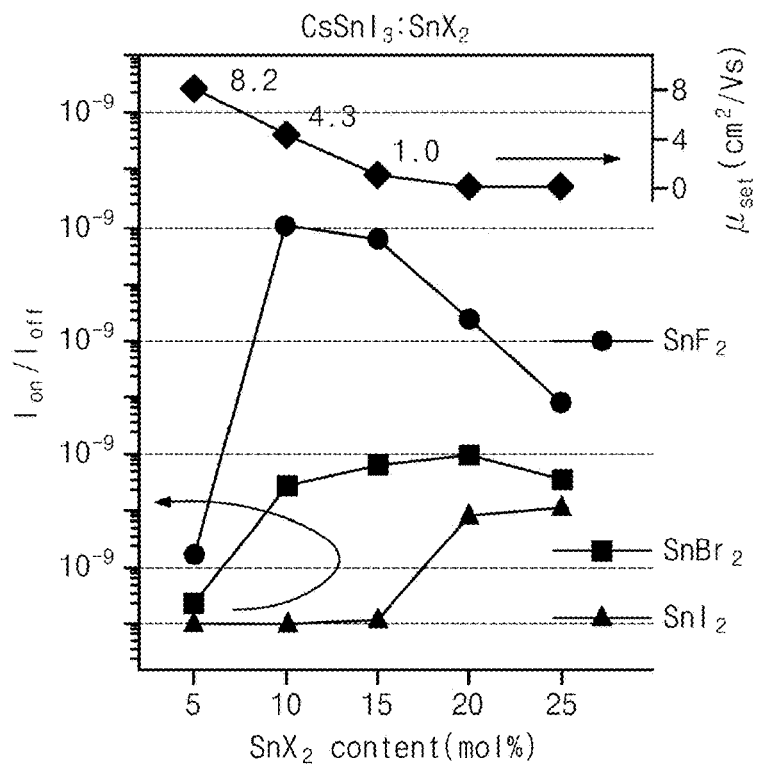

Referring to FIG. 7A, the change in the mobility and the current on/off ratio of the transistor when each of $SnF_2$, $SnBr_2$, and $SnI_2$ additives is added may be identified. Based on a result of the measurement, it may be identified that all three additives improve performance compared to that of one without the additive, and the addition of $SnF_2$ achieves the greatest performance improvement.

Figure 7B:
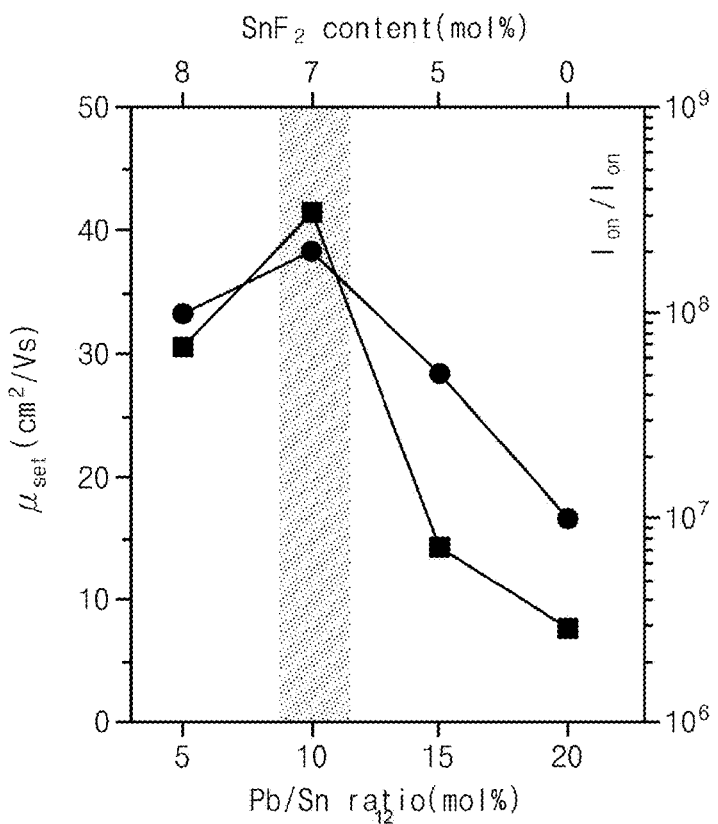

Further, referring to FIG. 7B, a mobility and a current on/off ratio of the thin-film transistor based on a ratio of a Sn content and a Pb content when a mixture of the additives $SnF_2$ and $PbI_2$ as the first additive and the second additive, respectively is added to the semiconductor layer may be identified.

Figure 8:
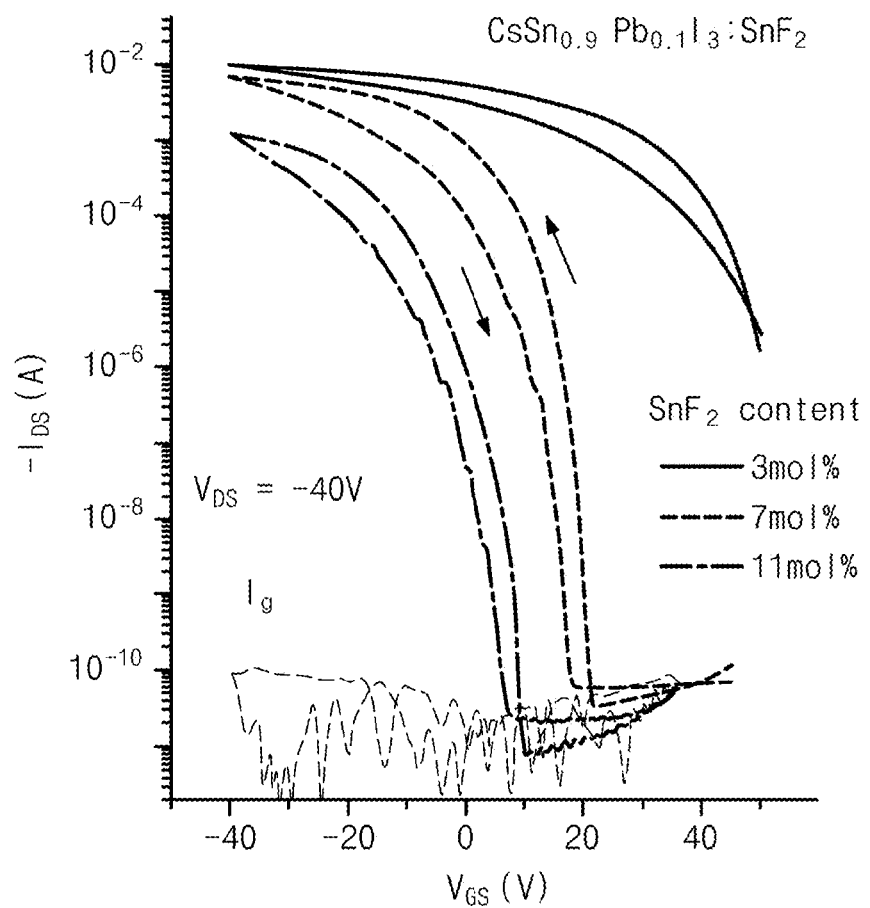

Further, FIG. 8 shows a transfer curve based on 3, 7, and 11 mol % as a content of $SnF_2$ as added to the semiconductor layer.

Referring to FIG. 8, the addition of $SnF_2$ gradually lowers the off-current, which enables an off-current operation of the transistor.

However, when the amount of $SnF_2$ as added exceeds a necessary amount (in one example according to FIG. 7, 11 mol %), the ON current decreases. Thus, it is desirable to properly adjust a content of the additive and add an appropriate amount of the additive thereto (7 mol % in one example according to FIG. 7).

Figure 9A:
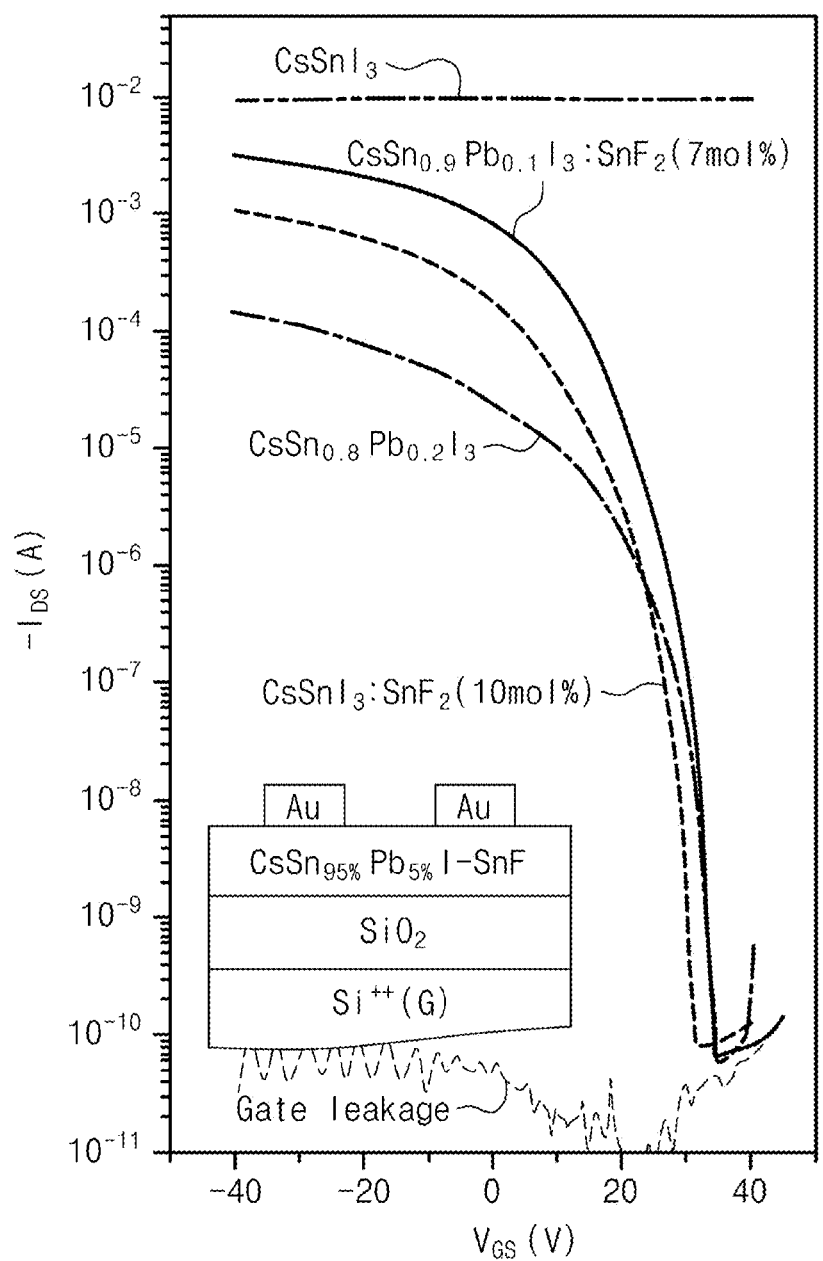

FIG. 9A shows a transfer curve when $SnF_2$ alone is added, a transfer curve when PbI alone is added, and a transfer curve when a mixture of $SnF_2$ and PbI is added.

Figure 9B:
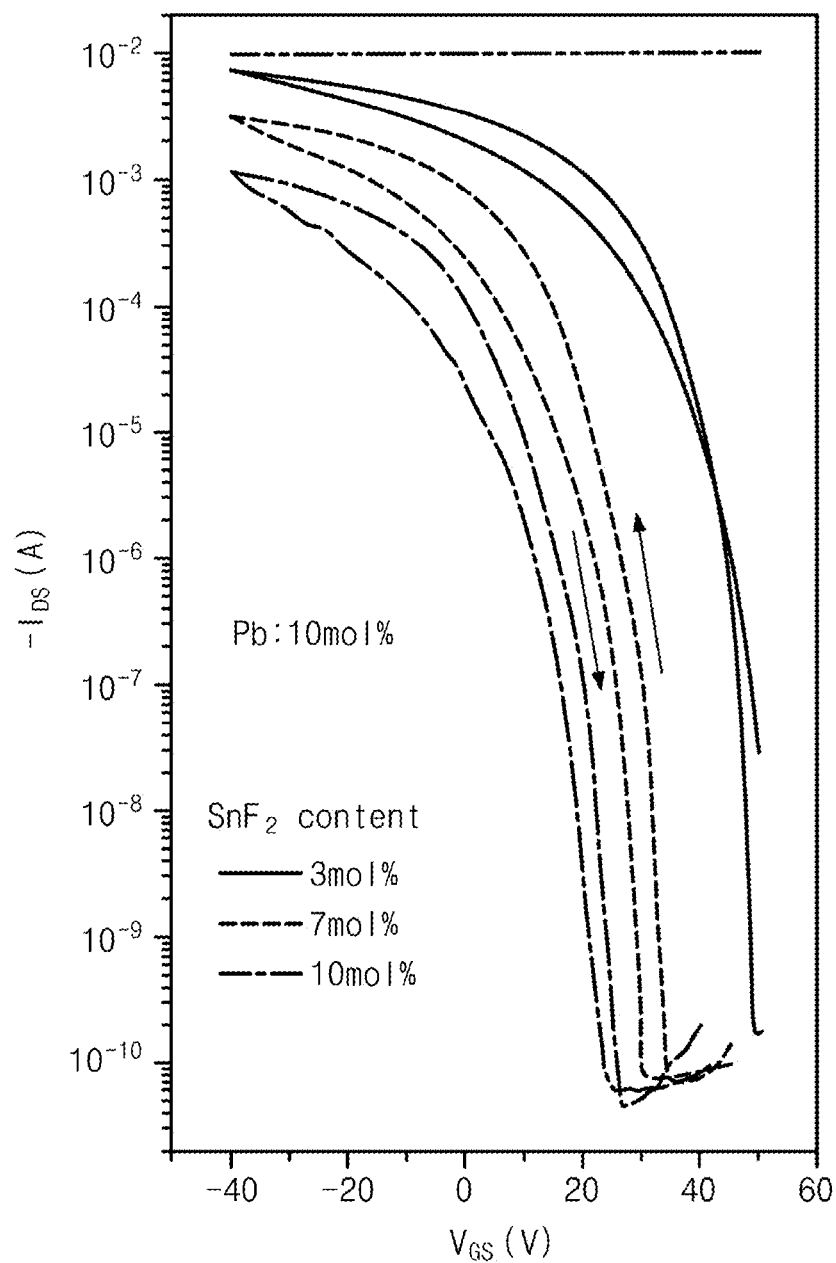
Figure 10A:
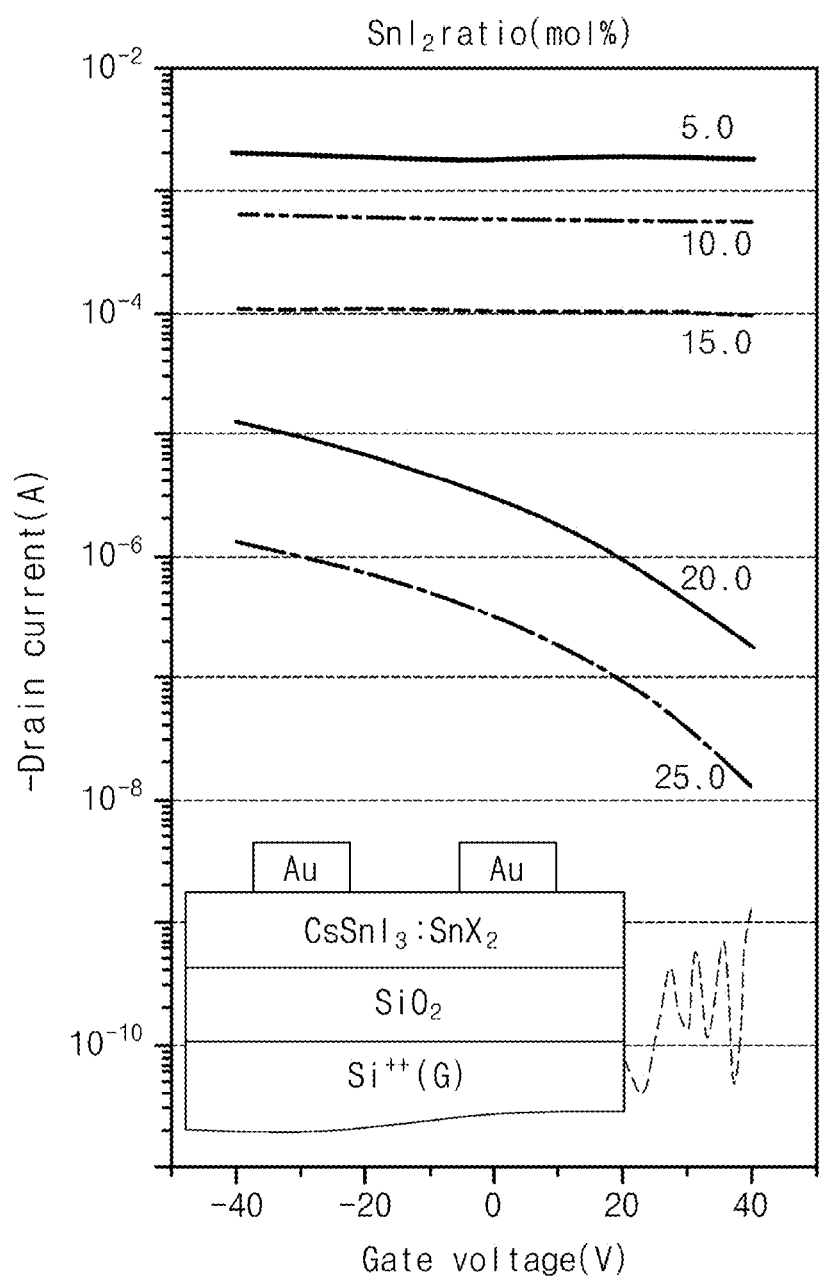
Figure 10B:
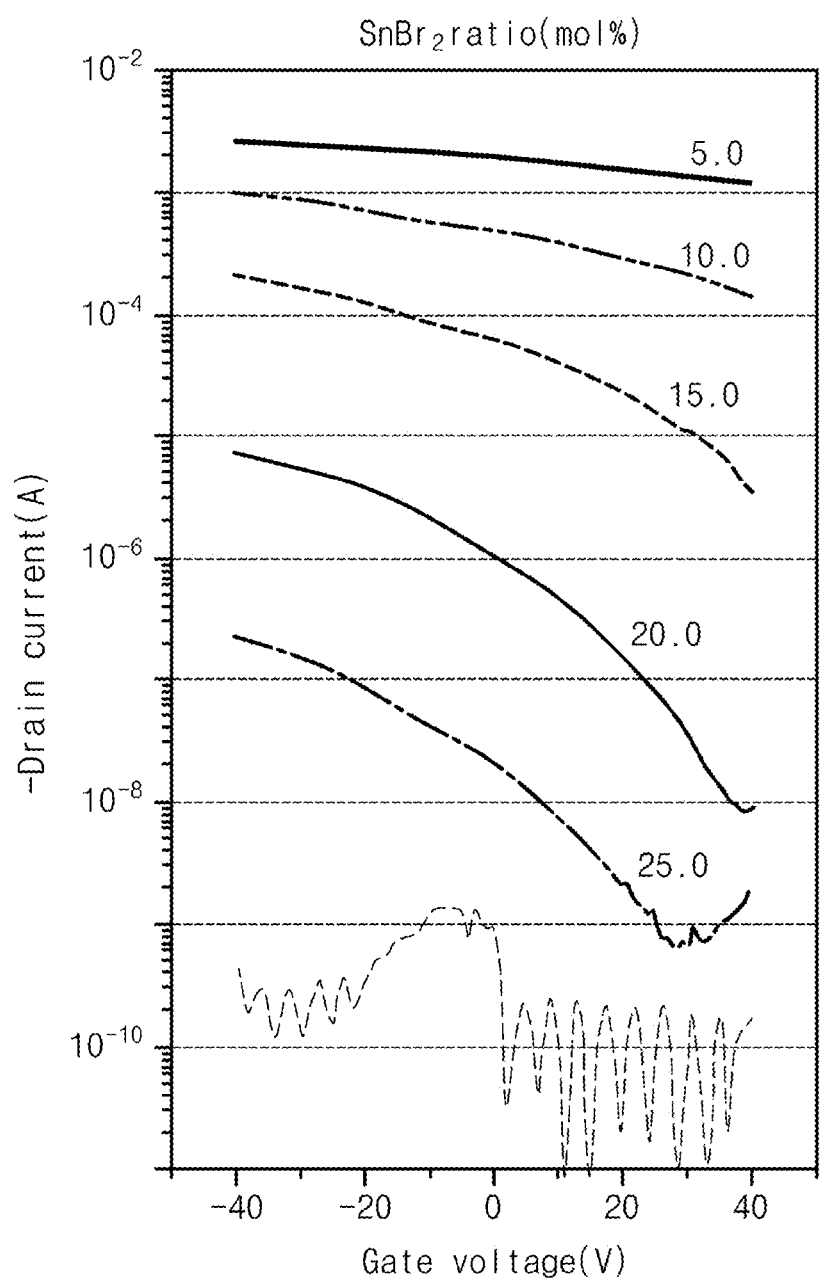
Figure 10C:
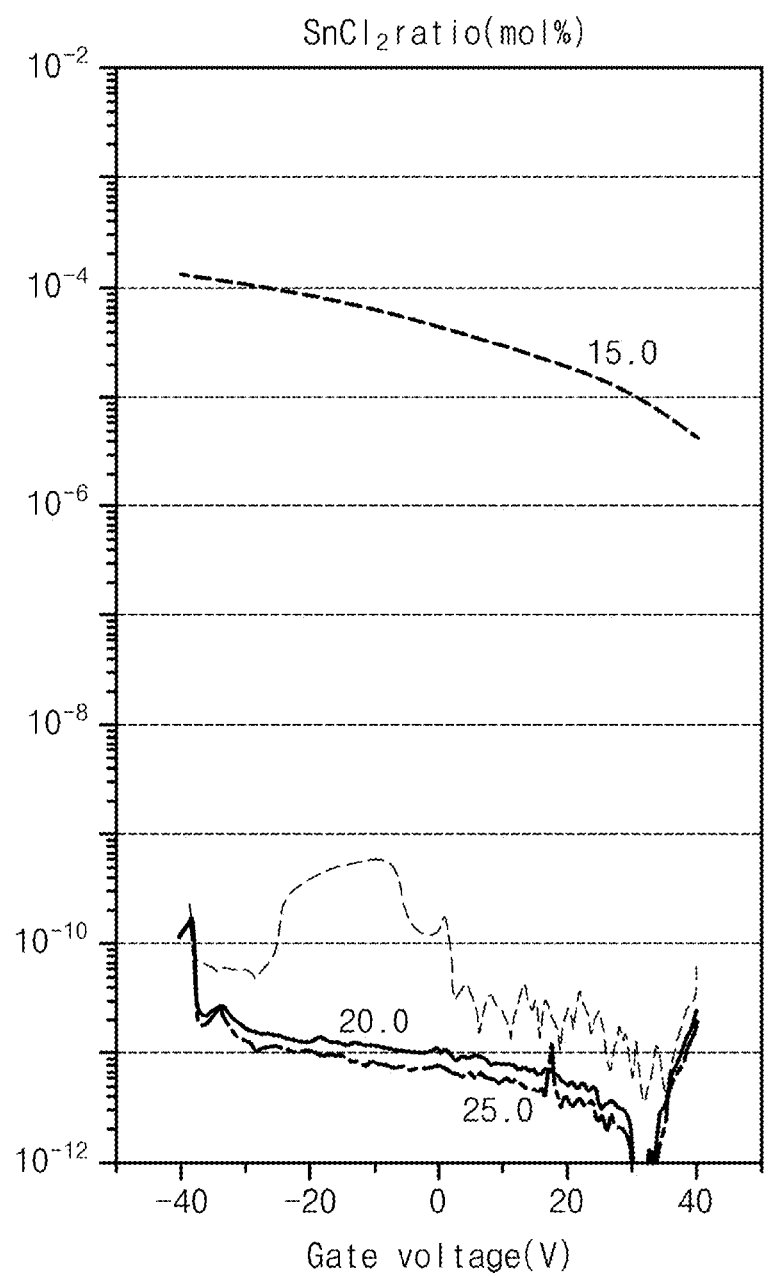
Figure 10D:
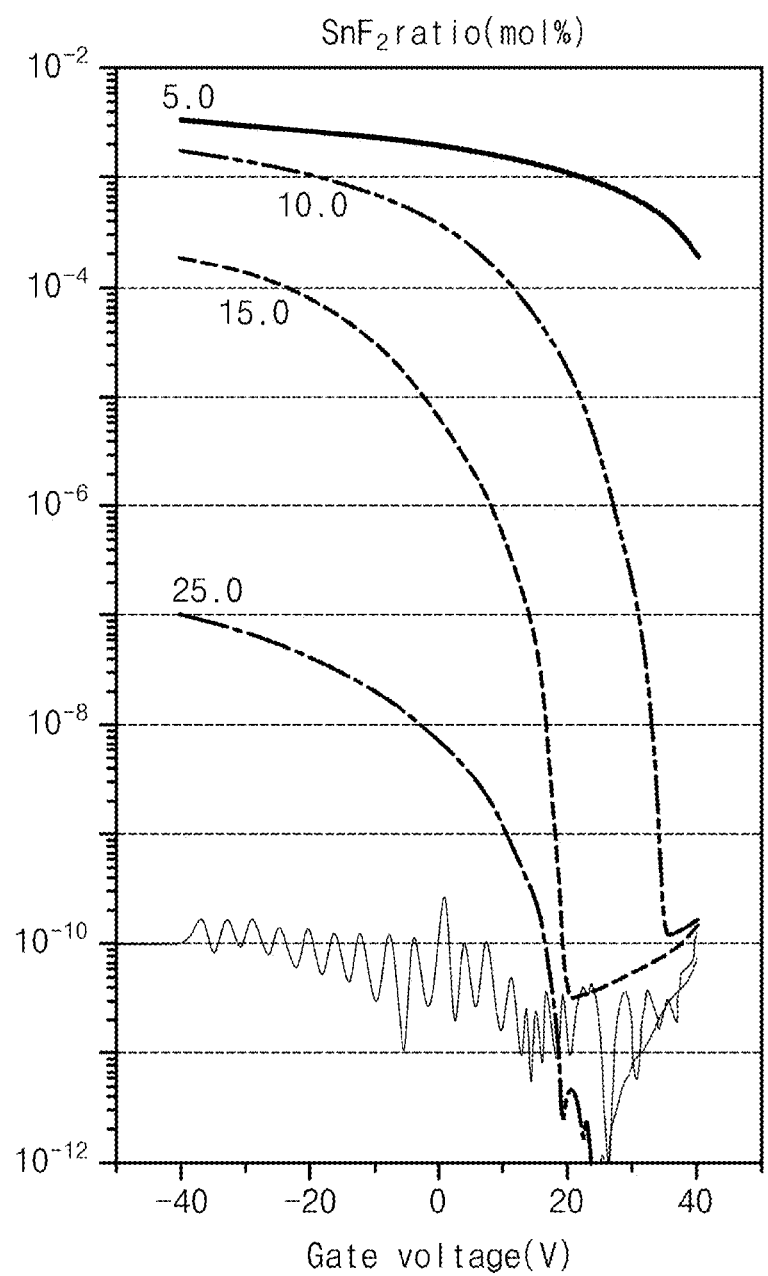

Further, FIG. 9B shows a transfer curve when no additive is added, and a transfer curve based on the $SnF_2$ addition amount when a mixture of $SnF_2$ and PbI is added.

In FIG. 9A, it may be identified that when no additive is added to $CsSnI_3$, that is, when no additive is added, the off current is very high, such that a resulting product does not work as the transistor and acts only as a conductor. That is, a charge amount of $CsSnI_3$ is very high such that the off current does not occur.

In this regard, referring to FIG. 9A and FIG. 9B, it may be identified that when a mixture of PbI and SnF is added to $CsSnI_3$, the off current occurs contrary to the case where no additive is added, and thus a high on/off ratio is achieved.

When no additive is added, many Sn vacancies may be formed in forming the thin-film made of $CsSnI_3$ and thus a high charge amount occurs. Thus, the resulting product cannot operate as a transistor and acts only as a conductor.

On the country, when the mixture of the additives is added, the added Pb and SnF may fill the Sn vacancies, thereby reducing the number of the vacancies such that semiconductor property is achieved.

When the amount of the added additive is greater than a critical value (for example, 10 mol % of $SnF_2$ in FIG. 9B), this lowers a charge amount, so that the on current value is lower than a necessary level, which may lower transistor mobility.

FIG. 10 shows a transfer curve according to the addition of each of (a) $SnI_2$, (b) $SnBr_2$, (c) $SnCl_2$, and (d) $SnF_2$ to the $CsSnI_3$ semiconductor thin-film.

Referring to FIG. 10, it may be identified that when the first additive as a Sn-based additive is added to the $CsSnI_3$ semiconductor thin-film, the transistor operation is achieved according to the addition of the first additive.

Referring to FIG. 10, the off-current does not occur when the first additive is not added. However, when an addition amount of the first additive increases, the off-current may decrease. Thus, it may be identified that the charge amount of the semiconductor thin-film is lowered due to the addition of the additive.

The above detailed description is to illustrate the present disclosure. Further, the foregoing describes a preferred embodiment of the present disclosure, which may be used in a variety of different combinations, variations, and environments. That is, changes or modifications may be made within the scope of the concept of the disclosure disclosed in this specification, within the scope equivalent to the written disclosure and/or within the scope of skill or knowledge in the art. The written embodiment describes the best mode for implementing the technical idea of the present disclosure, and various changes required in the specific application field and use of the present disclosure may be made. Therefore, the above detailed description of the disclosure is not intended to limit the present disclosure to the disclosed embodiments. Further, the appended claims should be construed as including other embodiments.

The invention claimed is:

1. A thin-film transistor comprising:
a substrate including a gate electrode formed thereon;
a gate insulating film disposed on an entire face of the substrate;
a semiconductor layer disposed on an entire face of the gate insulating film; and
source and drain electrodes disposed on the semiconductor layer so as to be spaced apart from each other,
wherein the semiconductor layer includes cesium tin triiodide (CsSnI3) or methylammonium tin triiodide (MASnI3),
wherein the semiconductor layer further contains an additive,
wherein the additive is added at a content of 1 mol % to 30 mol % based on the semiconductor layer,
wherein the additive is a mixture of a first additive and a second additive,
wherein the first additive includes one of SnF2, SnBr2, SnI2, and SnCl2,
wherein the second additive includes one of PbI2, InI2, and SbI2.

2. A method for manufacturing a thin-film transistor, the method comprising:
forming a gate electrode on a substrate;
forming a gate insulating film on an entire face of the substrate including the gate electrode;
forming a semiconductor layer on the gate insulating film; and
forming a source electrode and a drain electrode on the semiconductor layer so as to be spaced apart from each other,
wherein in the forming of the semiconductor layer, the semiconductor layer includes cesium tin triiodide (CsSnI3) or methylammonium tin triiodide (MASnI3),
wherein the forming of the semiconductor layer includes adding an additive into the semiconductor layer,
wherein in the adding of the additive into the semiconductor layer, the additive is added at a content of 1 mol % to 30 mol % based on the semiconductor layer,
wherein in the adding of the additive into the semiconductor layer, the additive is a mixture of a first additive and a second additive,
wherein the first additive includes one of SnF2, SnBr2, SnI2, and SnCl2
wherein the second additive includes one of PbI2, InI2, and SbI2.

* * * * *